United States Patent [19]

Leopold

[11] Patent Number: 5,262,601
[45] Date of Patent: Nov. 16, 1993

[54] PRINTED CIRCUIT BOARD SWITCH WITH FLEXIBLE ARMATURE OR CONTACT ARM

[75] Inventor: Howard S. Leopold, Melville, N.Y.

[73] Assignee: Eagle Electric Mfg. Co., Inc., Long Island City, N.Y.

[21] Appl. No.: 950,023

[22] Filed: Sep. 24, 1992

[51] Int. Cl.$^5$ .................. H01H 1/06; H01H 9/00; H01H 21/00

[52] U.S. Cl. .................................. 200/6 R; 200/292

[58] Field of Search .............. 200/5, 16, 292, 5 R, 200/5 A, 6 R, 6 B, 6 BA, 6 BB, 6 C, 16 R, 16 A, 16 D, 275

[56] References Cited

U.S. PATENT DOCUMENTS

| | | | |
|---|---|---|---|
| 3,294,927 | 12/1966 | Hill | 200/5 |
| 3,731,014 | 5/1973 | Brady | 200/5 A |
| 3,745,288 | 7/1973 | Reimer | 200/16 A X |
| 4,128,744 | 12/1978 | Seeger | 200/5 A |
| 4,323,740 | 4/1982 | Balash | 200/5 A |
| 4,687,886 | 8/1987 | Pistor | 200/6 B |
| 4,857,683 | 8/1989 | Maser | 200/5 A |
| 5,032,695 | 7/1991 | Mullins | 200/5 A X |
| 5,061,094 | 10/1991 | Buttner et al. | 200/5 A X |

*Primary Examiner*—J. R. Scott
*Attorney, Agent, or Firm*—Kirschstein, Ottinger, Israel and Schiffmiller

[57] ABSTRACT

A section of a printed circuit board itself is used as an armature for an electrical switch. The armature section of the board is formed by a cutout, and is movable from an initial state to a final state, and is returnable by its inherent resilience to the initial state.

6 Claims, 2 Drawing Sheets

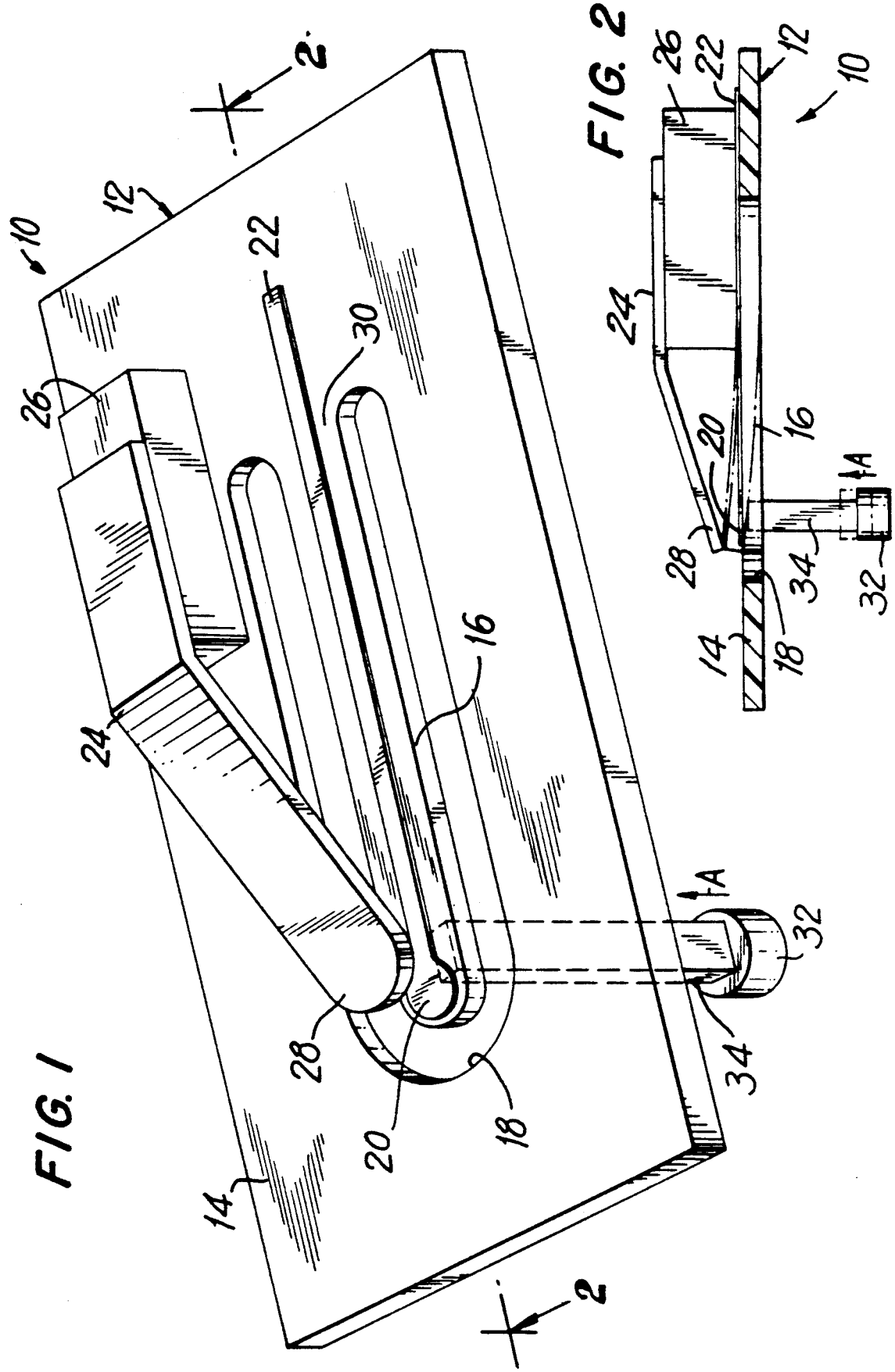

PRINTED CIRCUIT BOARD SWITCH WITH FLEXIBLE ARMATURE OR CONTACT ARM

BACKGROUND OF THE INVENTION

1. Field of the Invention

This invention generally relates to electrical switches and, more particularly, to switch constructions for use in equipment having printed circuit boards.

2. Description of Related Art

Printed circuit boards are omnipresent in electrical equipment. When electrical switches are needed to open and close electrical circuits in such equipment, and these switches are desired to be integrated with the printed circuit boards, the moving parts or armatures of such switches are separately mounted above and below such printed circuit boards which serve, therefore, as supports. For example, see U.S. Pat. No. 3,731,014 which shows a metal armature movable into switching contact with a printed circuit board. Also, see U.S. Pat. Nos. 4,128,744 and 4,323,740 which show a plastic armature movable into switching contact with a printed circuit board. In addition, see U.S. Pat. No. 4,857,683 which shows flexible film membranes movable into switching contact toward each other.

Although generally satisfactory for electrical switching purposes, the use of switch armatures separately mounted on a supporting printed circuit board represents not only an item of manufacturing cost which ideally one would like to eliminate, but also a source of bulk which limits the compactness of a switch installation.

SUMMARY OF THE INVENTION

1. Objects of the Invention

It is a general object of this invention to provide a low cost, compact, low profile electrical switch.

It is another object of this invention to eliminate the need for separately mounting switch armatures on a supporting printed circuit board.

Another object of this invention is to integrate an electrical switch with a printed circuit board so as to obtain an exceptionally compact construction.

2. Features of the Invention

In keeping with these objects, and others which will become apparent hereinafter, one feature of this invention resides, briefly stated, in an electrical switch comprising a printed circuit board which is constituted of a rigid, electrically insulating material. The board has a main section and an armature section integral therewith. The armature section is movable between switched states relative to the main section. The armature section has a movable electrical contact thereon, as well as an electrically conductive printed trace extending from the movable contact to an electrical circuit. The switch further comprises a stationary electrical contact having an electrical conductor extending therefrom to the electrical circuit. The stationary contact is in electrical communication with the movable contact in one of the switched states.

In the preferred embodiment, the armature and main sections of the board are constituted of a composite laminate of materials selected from the group consisting of phenolic, epoxy, paper and glass cloth. The movability of the armature section is advantageously achieved by forming a generally U-shaped cutout within the main section. The armature section may be moved directly or by means of an actuator.

In a normally closed electrical switch, the stationary and movable contacts engage each other in said one switched state, and are movable apart from each other to the other of the switched states by the actuator. In a normally open switch, the stationary and movable contacts are located apart from each other in the other of the switched states, and are movable into engagement with each other in said one switched state by the actuator.

In either switch configuration, the armature section is normally co-planar with the board, and is flexed therefrom out of the plane of the board by pressure exerted directly or by an actuator on the armature section. Upon release of such pressure, the armature section returns, due to its inherent resilience, to its initial co-planar position. Hence, the printed circuit board is no longer used as a support for a switch, but, instead, is fully integrated therewith by forming the printed circuit board itself as an armature section of the switch.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 1 is a perspective view of a normally open electrical switch in accordance with this invention;

FIG. 2 is a reduced scale sectional view taken on line 2—2 of FIG. 1;

DETAILED DESCRIPTION OF THE PREFERRED EMBODIMENTS

Figure 3:
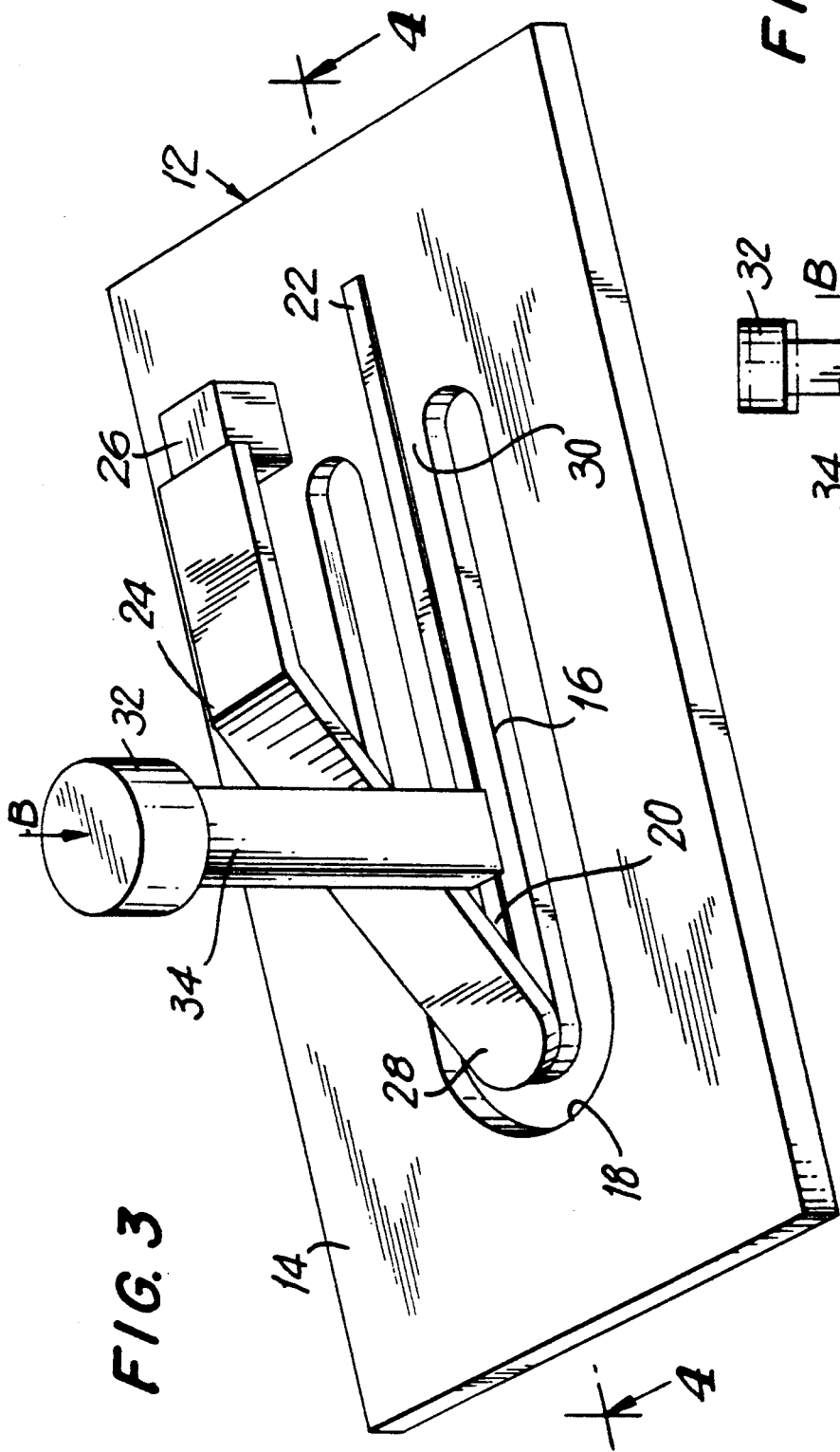
FIG. 3 is a perspective view of a normally closed electrical switch in accordance with this invention.

Referring now to the drawings, reference numeral 10 in FIGS. 1 and 2 depicts a normally open switch which includes a generally planar printed circuit board 12 constituted of a rigid, electrically insulating material, preferably NEMA-grade, CEM-1, standard material which is a composite laminate of epoxy, paper and glass cloth.

Board 12 has a main section 14 and an armature section 16 integral therewith. The armature section 16 is shown as an elongated arm bounded by a generally U-shaped cutout 18 formed within the main section 14. The armature section 16 has a movable electrical contact 20 thereon. An electrically conductive printed trace 22 extends from the movable contact 20 to an electrical circuit (not illustrated) to be switched.

An elongated electrical conductor 24 is mounted on an electrically insulating support 26 on the board 12. Conductor 24 extends from a stationary electrical contact 28 at one end to the non-illustrated electrical circuit at its opposite end. As best shown in FIG. 2, the stationary contact 28 is normally located above, and at a distance from, the movable contact 20.

In accordance with this invention, the armature section 16, due to the formation of the cutout 18, is movable relative to the main section 14. The armature section 16 forms a living hinge 30 with the main section 14.

The armature section 16 is movable from a normally open switching state (illustrated in solid lines in FIG. 2) in which the movable and stationary contacts 20, 28 are spaced apart, to a closed switching state (illustrated in phantom lines in FIG. 2) in which the movable and stationary contacts engage each other. The armature section can be flexed out of its initial position in which it is co-planar with the board 12 by pressure exerted directly in the direction of arrow A against the armature section, or, as shown, by pressure exerted on an actuator having a button 32 and a finger 34 bearing directly against the armature section 16. Upon release of such pressure, the armature section returns, due to its inherent resilience, from its flexed position in which it is inclined relative to the board, back to its initial co-planar position.

Figure 4:
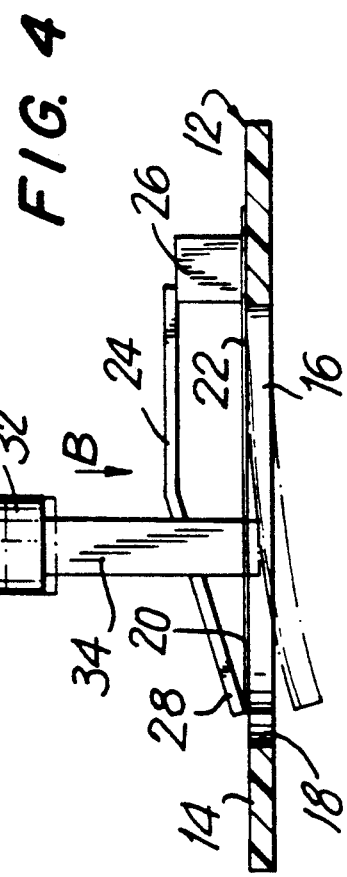
FIG. 4 is a reduced scale sectional view taken on line 4—4 of FIG. 3.

A normally closed switch is depicted in FIGS. 3 and 4, and, like parts with that of the normally open switch of FIGS. 1 and 2 have been identified with the same reference numerals. The essential difference between these switches is that the movable and stationary contacts 20, 28 of the normally closed switch are normally in engagement with each other, and are moved apart by exerting pressure on the actuator button 32 in the direction of arrow B. Otherwise, the operation is completely analogous.

In other variants, the flexibility of the armature section 16 can be achieved by differently shaped cutouts in the printed circuit board. For example, if the armature is located at a corner of the board 12, a single linear slit is all that is necessary to form a living hinge with the remainder of the board, thereby achieving the desired flexibility for the armature section. The conductor 24 and its support 26 could advantageously be another printed circuit board wherein the conductor 24 is formed as an electrically conductive trace printed thereon. Alternatively, the conductor 24 and its support 26 could be mounted on an adjacent structure other than the printed circuit board containing the armature section.

In brief, a portion of a standard printed circuit board itself is directly used as an armature or movable arm of an electrical switch by flexing the arm through a distance to bring a movable contact into engagement with a stationary contact for a normally open switch, or to bring a movable contact out of engagement with a stationary contact for a normally closed switch. The switches described herein are of the momentary-action type, but sustained-action types can also be used.

It will be understood that each of the elements described above, or two or more together, also may find a useful application in other types of constructions differing from the types described above.

While the invention has been illustrated and described as embodied in a printed circuit board switch, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

I claim:

1. An electrical switch, comprising:
    (a) a generally planar printed circuit board constituted of a rigid, electrically insulating material for rigidly supporting an electrical circuit, said board having opposite major surfaces, electrically conductive, printed traces located solely at one of he major surfaces of the board, a generally planar, rigid main section having a predetermined width, and a cutout for forming a generally planar, resilient armature section of reduced width less than said predetermined width, but still integral with the main section, said armature section being resiliently movable, due to the presence of the cutout, relative to the main section, from a first switched state in which the armature section is generally co-planar with the main section, to a second switched state in which the armature section si inclined relative to the main section, said armature section having a movable electrical contact thereon and one of the printed traces extending from the movable contact to the electrical circuit stationarily mounted on the board; and
    (b) a stationary electrical contact located remotely from the board and having an electrical conductor extending therefrom to the electrical circuit, said stationary contact being in electrical communication with the movable contact in one of said switched states.

2. The switch according to claim 1, wherein the armature and main sections of the board are constituted of a opposite laminate of materials selected from the group consisting of phenolic, epoxy, paper and glass cloth.

3. The switch according to claim 1, wherein the armature section is an elongated cantilever arm bounded by the cutout, said cutout having a generally U-shaped configuration formed within the main section.

4. The switch according to claim 1; and further comprising actuator means for moving the armature section.

5. The switch according to claim 4, wherein the stationary and movable contacts engage each other in said one switched state, and are movable apart from each other to the other of the switched states by the actuator means.

6. The switch according to claim 4, wherein the stationary and movable contacts are located apart from each other in the other of the switched states, and are movable into engagement with each other in said one switched state by the actuator means.

* * * * *